(12) United States Patent
Kiani

(10) Patent No.: US 7,071,764 B1
(45) Date of Patent: Jul. 4, 2006

(54) BACK-DRIVE CIRCUIT PROTECTION FOR I/O CELLS USING CMOS PROCESS

(75) Inventor: Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 342 days.

(21) Appl. No.: 10/206,541

(22) Filed: Jul. 26, 2002

(51) Int. Cl.
*H03K 3/00* (2006.01)

(52) U.S. Cl. ........................ 327/437; 327/108
(58) Field of Classification Search ................ 327/437, 327/108, 534; 326/81, 27, 58
See application file for complete search history.

(56) References Cited

U.S. PATENT DOCUMENTS 5,467,031 A * 11/1995 Nguyen et al. ............. 327/534
6,249,410 B1 * 6/2001 Ker et al. ..................... 361/56

* cited by examiner

*Primary Examiner*—Dinh T. Le
(74) *Attorney, Agent, or Firm*—Jurgen Vollrath

(57) ABSTRACT

In a high tolerance I/O interface with over-voltage protection beyond 5 V, a cascoded driver with PMOS pull-up and NMOS pull-down transistors, connected to a pad, is provided. Circuitry is included to maintain the floating well voltages of the PMOS pull-up driver transistors at substantially the same voltages as their respective drains, and their gate voltages at substantially the same voltages as their respective drains, under back-drive and 5 V tolerant mode. Circuitry is also provided to increase the gate voltage of one of a cascoded pair of NMOS pull-down driver transistors, so that the drain-source junction voltage and gate oxide voltage of the transistor will be less than the breakdown voltage under back-drive and 5 V tolerant mode.

15 Claims, 3 Drawing Sheets

| FIG. 4A | FIG. 4B | ns per page
BACK-DRIVE CIRCUIT PROTECTION FOR I/O CELLS USING CMOS PROCESS

FILED OF THE INVENTION

The invention relates to a method and system for providing back-drive circuit protection for I/O cells in a CMOS integrated circuit device.

BACKGROUND OF THE INVENTION

A typical integrated circuit device (IC) includes a core region 100, as illustrated in FIG. 1, and one or more functional elements or packages such as analog support/conversion circuitry 102. These are connected through an I/O interface 104 to pads 106 that allow the IC to be connected externally to other devices. The voltage levels vary for different portions of the IC, thus requiring special consideration to avoid exposing the various portions of the IC to excessive voltage levels. For instance, the core, I/O interface, and external circuitry to which the pads of the IC connect, typically will each support different voltages. Even within a typical CMOS core, voltages vary depending on the process used. For example, a 0.25 μm process supports voltage levels of the order of 2.5 V±10%; a 0.18 μm process supports voltage levels of the order of 1.8 V±10%; a 0.15 μM process supports voltage levels of the order of 1.5 V±10%, and a 0.13 μm process supports voltage levels of the order of 1.2 V±10%. In contrast, the I/O interface needs to support 3.3 V typically. For ease of understanding the input voltage levels to the core have been identified as VDD and VSS while those for the I/O interface are indicated as VDDIO and VSSIO. Furthermore, the pads may be connected to circuitry operating in the 5 V range. For example, where the IC drives a PCI bus, it is important that the IC can withstand the higher voltages of the system that it is supporting. In order to supply the higher voltage, a dual gate process involving the use of thick gate oxides is commonly used in the case of sub-micron CMOS.

The main concern arises under stress mode conditions when the pads are exposed to high voltages (approximately 5.5 V) by the external circuitry. Furthermore, different stress mode conditions may be identified. In particular, it is common to reduce VDD and VDDIO to 0 V when the circuitry of the IC is not in use, thereby conserving energy.

An IC may typically be operated in one of three modes: (a) Normal mode, in which the core is powered up and drives the pads; (b) Tolerant mode, which is a stress mode in which the pads are raised up to 5.5 V, while the core and I/O interface are powered up (VDD and VDDIO are high); (c) Back-drive mode, which is a stress mode in which the pads are raised up to 5.5 V, while the core and I/O interface are powered down (VDD and VDDIO are low). Thus back-drive refers to the 5.5 V tolerant interface when there are no power supplies asserted. This condition becomes particularly important in the case of sub-micron CMOS, dual gate process technology in which the oxide breakdown and drain-source junction breakdown is about 3.8 V. Back-drive I/Os have to tolerate 5.5 V at the pads with and without power supplies asserted (commonly referred to as 5 V tolerant level due to the 5 V±10% tolerance). However, under stress mode, sub-micron dual gate devices tend to experience problems such as oxide breakdown, drain-source junction breakdown, current flow to VDDIO, and well charging due to the parasitic internal diode structure of CMOS devices.

FIG. 2 shows a simple I/O interface driver circuit comprising a p-channel (PMOS) pull-up transistor 200 and a n-channel (NMOS) pull-down transistor 210 which accommodate different load conditions under normal operation. When PMOS 200 is on and NMOS 210 is off, the load can be charged up to VDDIO. On the other hand, when PMOS 200 is off and NMOS 210 is on, the load can discharge to VSSIO. Thus the driver's output to the pad will, under normal operation, provide voltages ranging from VDDIO to VSSIO. Since VDDIO (3.3 V±10% under normal operation) is applied to both gates of the transistors 200, 210 one transistor will always be off, thereby avoiding shoot-through current through the driver transistors 200, 210.

However, under 5 V tolerant mode and back-drive mode, the pad 212 is raised to 5.5 V. In order to avoid gate oxide breakdown the voltage drop from drain to gate must not exceed 3.8 V. Similarly, to avoid junction breakdown, the voltage drop from drain to source must not exceed 3.8 V. Furthermore, it is necessary to isolate the receiver input circuitry from the pad under these stress modes. Since, during stress mode, the pad cannot be driven by the pre-driver circuit, both transistors 200, 210 have to be turned off. Turning off the PMOS transistor 200 also avoids current flow from the pad 212 to VDDIO. The PMOS transistor is ideally turned off by tying the gate of PMOS 200 high relative to the high voltage. However, when the pad voltage exceeds VDDIO by VTP, the PMOS will not shut off. The NMOS transistor, in turn, is turned off by applying a low voltage such as VSSIO to the gate of NMOS 210 relative to the drain.

Thus, in the circuit of FIG. 2, during 5 V tolerant mode (5.5 V on the pad) when the gate of PMOS 200 is at VDDIO (i.e. about 3.3 V for 5 V tolerant mode) the drain to gate voltage is 2.2 V and is thus less than the oxide breakdown voltage, which is about 3.8 V. However, this does not turn off transistor 200. The forward biased internal parasitic diode (indicated by reference numeral 216) allows current flow of the order of milliamps. This results in heating of the cell and possible latch-up. In back-drive mode, when VDDIO is 0 V, the situation is even worse. The voltage to the source and gate of PMOS 200 is 0 V. This not only turns the transistor 200 on but also provides a voltage drop of 5.5 V across the drain-source junction and gate oxide which can cause irreparable damage.

One proposed prior art solution proposed for 5 V tolerant mode to reduce the junction voltages of the driver pull-up and pull-down transistors is to use cascoded p-channel pull-up transistors and cascoded n-channel pull-down transistors in the driver circuit, as shown in FIG. 3, in order to split the voltage across two pull-up and two pull-down transistors. The operation remains the same as for the simple circuit of FIG. 2, since one of the transistors in each cascoded pair is always kept on in normal mode, and the other transistor in each cascoded pair performs the toggling function to accommodate the load on the pad. Thus transistors 300 and 312 are always on during normal mode. It will be noted that even with NMOS transistor 300 asserted, current is prevented from flowing through the NMOS transistors 300, 302 by grounding the gate of transistor 302 which switches transistor 302 off.

In back-drive mode the gate voltages of the driver output transistors are raised to prevent gate oxide damage. Also, to avoid current flow through PMOS transistor 312, the gate of PMOS 312 is charged to the same voltage as its drain. In order to prevent parasitic diode well charging, during back-drive mode and 5 V tolerant mode, the floating n-wells of the PMOS transistors 310, 312 are charged up to FW3 and FW5, respectively (the same voltage as their respective drains). The well charging is achieved by adding a PMOS transistor 314 acting as a switch. With the gate of transistor 314 held sufficiently low relative to its source, i.e when the pad voltage is greater than VDDIO by at least a diode drop, the switch is closed and the voltage of the well is brought up to the level of the pad (5.5 V in stress mode). Gate oxide breakdown and current through the PMOS 312 is prevented by including the PMOS transistor 316 acting as a switch which brings up the voltage of the gate of transistor 312 when the gate of transistor 316 is low relative to the pad voltage. However, in addition to the forward biased internal parasitic diode 322, there is a forward biased parasitic diode 320 in transistor 310 and a reverse biased parasitic diode 324. The diode 324 causes leakage current of the order of 10 nA to flow through the diode 324 during back-drive mode. This charges the drain of transistor 310 to 5.5 V which causes gate oxide breakdown and junction breakdown problems for transistor 310.

The present invention seeks to address the problems of the prior art and enhance the tolerance of an I/O interface to provide tolerance during 5 V tolerant and back-drive mode.

SUMMARY OF THE INVENTION

The present invention provides a method and circuit for enhancing the tolerance of I/O interfaces to provide tolerance not only during 5 V tolerant mode but also during back-drive mode.

According to the invention there is provided circuitry to limit the reverse potential difference across the CMOS transistors to avoid gate oxide and drain-source junction break down, and to avoid current flow to VDDIO and prevent parasitic diode well charging. In particular the invention provides for a bias circuit supplied by a high external voltage, such as the pad voltage, to charge up the floating wells and floating nodes in order to limit the static DC bias potential below the maximum stress level of the CMOS process. Preferably the resultant back-drive circuit comprising the I/O interface with its bias circuit is not only back-drive tolerant but is also 5.5 V tolerant when power supplies are asserted. Typically the worst case DC current during back-drive mode is less than 10 µA.

According to the invention, there is provided a cascoded driver circuit that includes a circuit for charging the gates and wells of cascoded PMOS transistors of the driver circuit to the voltages of their respective drains.

Further, according to the invention, there is provided a driver circuit comprising a first PMOS transistor connected to a pad, a second PMOS transistor connected with its drain to the source of the first PMOS transistor, a first NMOS transistor with its drain connected to the pad, and a second NMOS transistor with its drain connected to the source of the first NMOS transistor, wherein the gate of the first PMOS transistor is charged to the pad voltage, the well of the first PMOS transistor is charged to the pad voltage, the drain of the second PMOS transistor is charged to a voltage that avoids drain-source junction breakdown of the second PMOS transistor, and the gate and well of the second PMOS transistor are charged to the voltage of the drain of the second PMOS transistor. The gate of the first PMOS transistor is preferably charged to the pad voltage by connecting the gate to the pad through a switch that is switched on when the pad voltage exceeds approximately 3.6 V. The well of the first PMOS transistor may be charged to the pad voltage through a switch that is switched on when the pad voltage exceeds approximately 3.6 V. The drain of the second PMOS transistor may be charged to a voltage that avoids drain-source junction breakdown of the second PMOS transistor by providing a current path to VSSIO wherein the current path defines a plurality of diode voltage drops to VSSIO, preferably 3.6 V in total. Preferably the gates of the PMOS transistors are isolated by a switch when their voltages are different. Typically a pre-driver circuit is connected to the gates of the PMOS transistors and is isolated from high stress mode voltages from the driver circuit by pass gates. The pass gates between the pre-driver circuit and the gate of the first PMOS transistor may comprise two NMOS transistors in series, and the pass gates between the pre-driver circuit and the gate of the second PMOS transistor may comprise a PMOS and a NMOS transistor in parallel.

Further, according to the invention, there is provided a method of enhancing the tolerance of a drive circuit during stress mode, comprising providing a cascoded circuit of a first PMOS transistor connected to a pad, a second PMOS transistor, and first and second NMOS transistors, charging the gates of the PMOS transistors to avoid gate oxide breakdown, clamping the node between the PMOS transistors to avoid junction breakdown of the second PMOS transistor, switching off both PMOS transistors during stress mode, and providing a current path to ground for leakage current flowing through the reverse biased parasitic diode of the first PMOS transistor.

DETAILED DESCRIPTION OF THE INVENTION

The present invention proposes certain changes and additions to a cascoded driver circuit in order to improve tolerance under stress mode. In particular, the invention seeks to avoid gate oxide breakdown of the PMOS transistors by charging up the gates so that the gate-drain voltage is always less than 3.8 V. It also seeks to avoid current to VDDIO by switching the PMOS transistors off. This is achieved by charging the gates of the transistors to the same voltage as the high voltage node (drain) during stress mode. The invention also seeks to avoid parasitic well charging of the PMOS transistors by charging the wells to the same voltage as their respective high voltage nodes (drains). The invention also seeks to avoid drain-source junction breakdown of the upper PMOS transistor by reducing the potential difference across the transistor to less than 3.8 V. This is achieved by charging the drain of the upper PMOS transistor to approximately 3.3 V. The invention further seeks to avoid leakage current, which flows through the reverse biased parasitic diode of the lower PMOS transistor, from flowing through the upper PMOS transistor. This is achieved by clamping the gate and drain of the upper PMOS transistor to the same potential (NG1).

Figure 1:
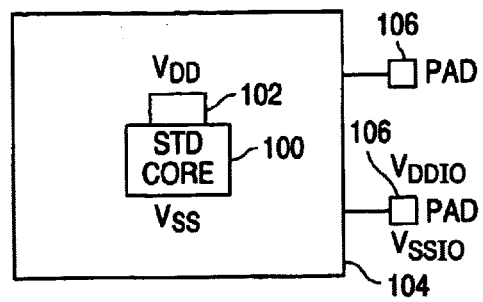
FIG. 1 is a simple representation of a typical prior art integrated circuit device.
Figure 2:
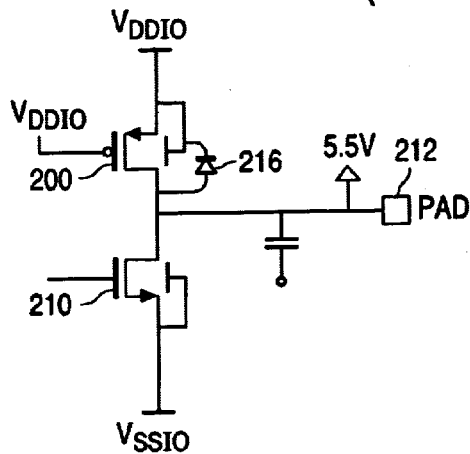
FIG. 2 is a simple prior art pull-up and pull-down structure for a driver circuit.
Figure 3:
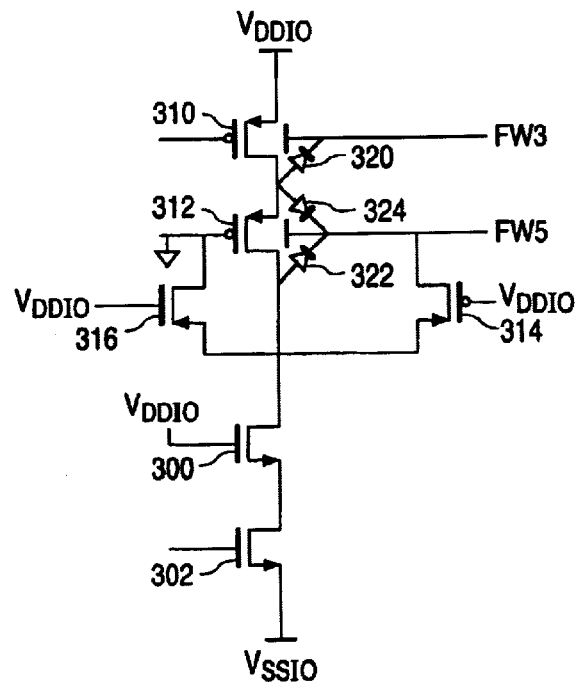
FIG. 3 is another prior art pull-up and pull-down structure for a driver circuit used for 5 V tolerant mode.
Figures 4, 4A:
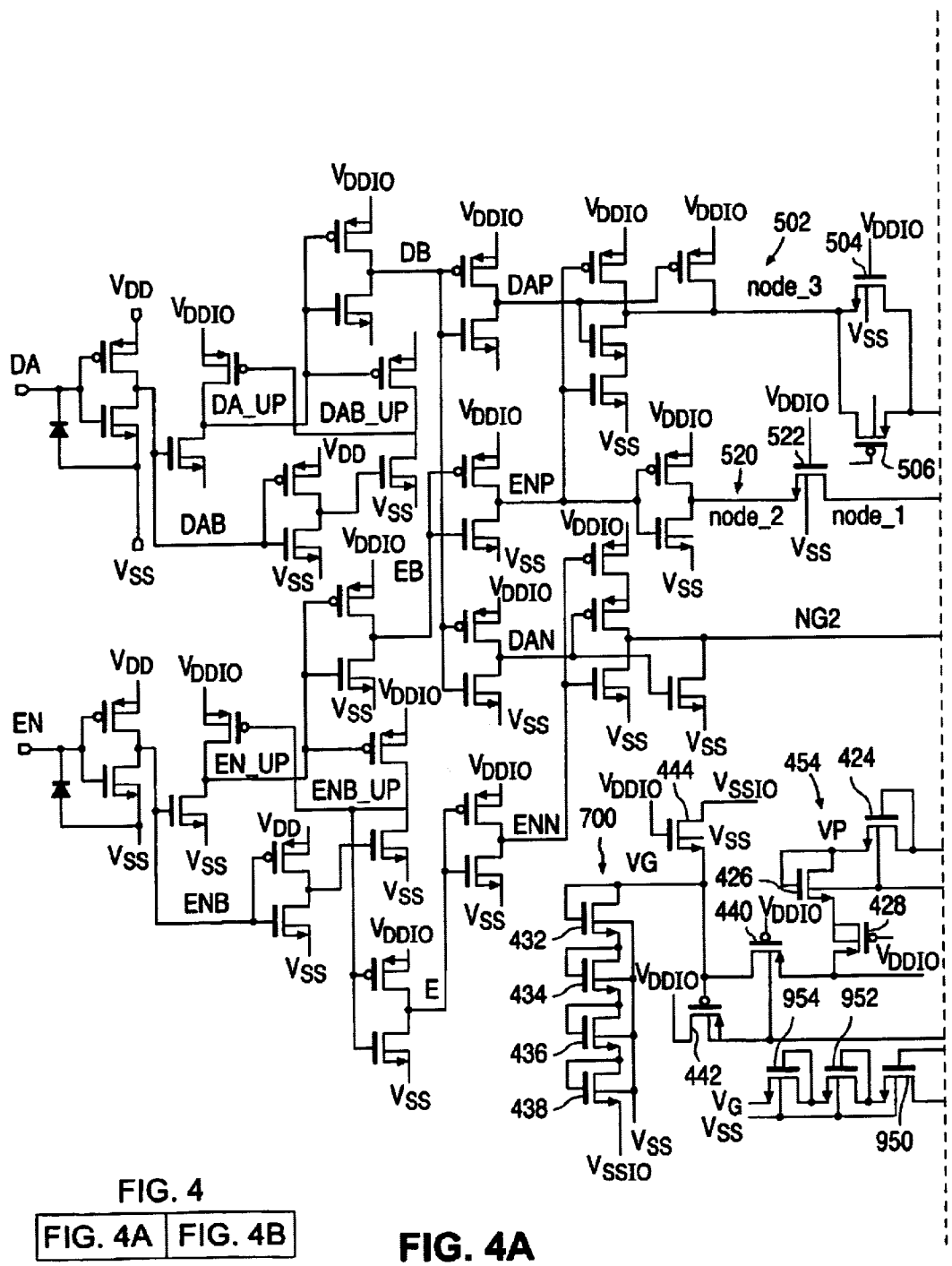
FIG. 4 is a schematic circuit diagram of one embodiment of the invention.
Figure 4B:
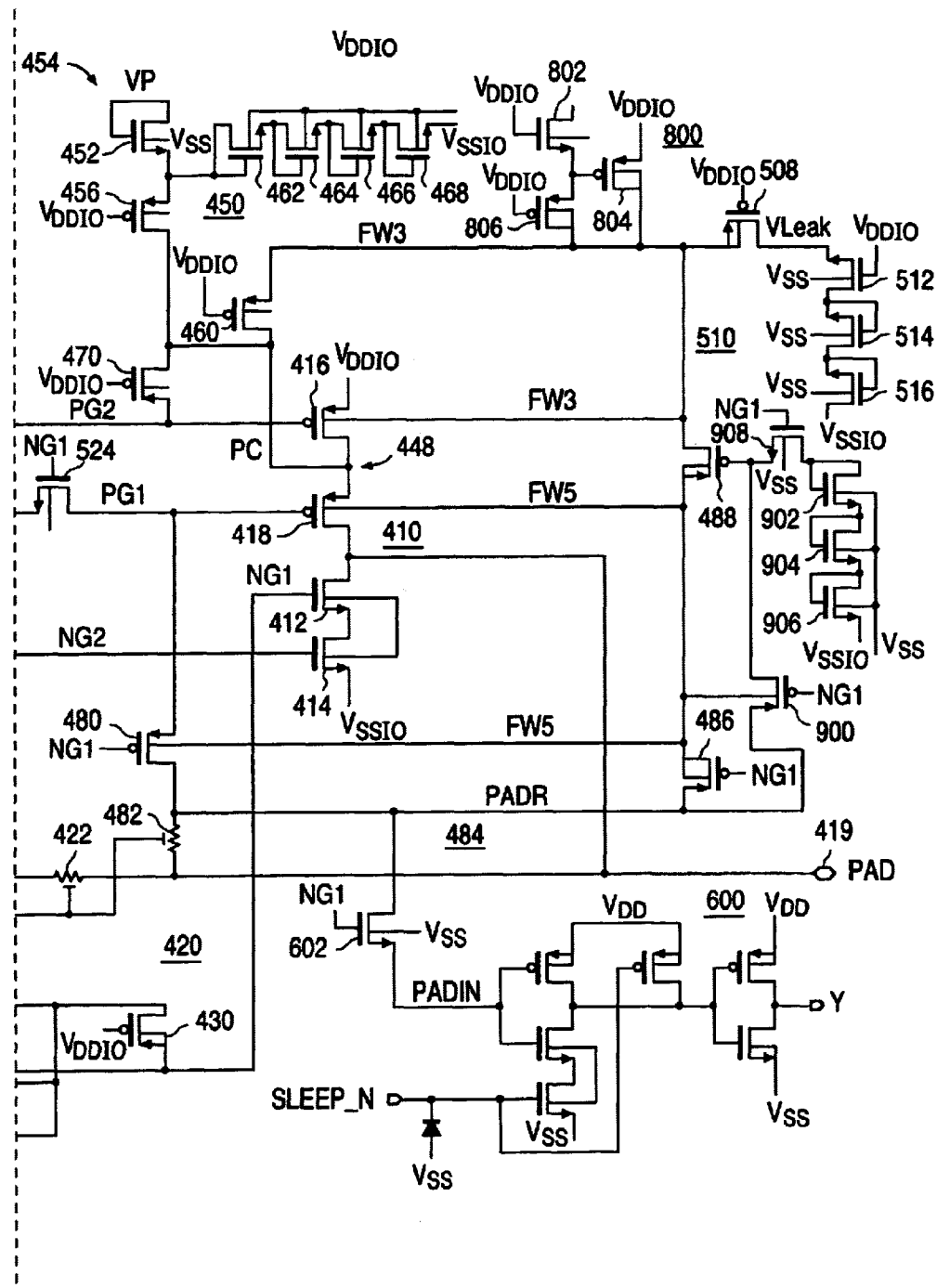

FIG. 4 shows a schematic circuit diagram of one embodiment of the invention. A PMOS pull-up and NMOS pull-down structure is indicated generally by reference numeral 410 and includes a cascoded pair of NMOS transistors 412, 414 and a cascoded pair of PMOS transistors 416, 418.

In order to ensure that transistor 412 is on, the gate is connected to the pad contact 419 (which is at about 5.5 V)

via a sub-circuit indicated generally by reference numeral 420. In particular, the gate of transistor 412 is connected to the pad contact 419 through a resistor 422, and two n-channel transistors 424, 426 connected as diodes. During back-drive mode, when VDDIO is 0 V two switches in the form of p-channel transistors 428, 430 are switched on to provide NG1. (transistors 432, 434, 436, 438 provide a current path to VSSIO as is discussed in greater detail below) The resistor 422 and two diodes 424, 426 thus drop the voltage from the pad to VDDIO, which is used to provide NG1 during back-drive mode. In order to provide a stable voltage during back-drive mode, a current path is provided for the pad voltage. NMOS transistors 432, 434, 436, 438 provide the current path for the biasing current during back-drive mode. PMOS transistor 440, acts as a switch that is switched on to provide the current path to the transistors 432, 434, 436, 438 and to apply a high voltage to the gate of transistor 442, thus shutting transistor 442 off and avoiding a current path to VDDIO.

During 5 V tolerant mode, transistors 428, 430 are turned off since their gates are connected to VDDIO, which is at VDDIO during 5 V tolerant mode. NG1 is then supplied by transistor 442, which is switched on by NMOS transistor 444. (A current path to VSSIO is provided by transistors 950, 952, 954 in this case).

Thus, during stress mode, the gate of transistor 412 is charged to VDDIO, and the source will be VTN below the gate voltage. Thus the gate-source voltage and source-drain voltage of transistor 412 will be less than the allowable limit of 3.8 V.

Furthermore, since the gate of transistor 414 is at 0 V, no conduction takes place through the transistor pair 412, 414.

Another aspect that has to be addressed is setting up the voltages for pull-up transistors 416, 418.

During backdrive mode, the sub-circuit 420 also provides the voltage to the gate and well of transistor 416 and the node 448 between the drain of transistor 416 and the source of transistor 418. (This avoids gate oxide breakdown and drain-source junction breakdown of the transistor 416.) This charging of the node 448 and the well and gate of transistor 416 is performed, in back-drive mode, through the sub-circuit indicated generally by reference numeral 450. Transistor 452 is formed as a diode and is connected to node 454 (VP—see also sub-circuit 420). PMOS transistor 456 acts as a switch, which is closed when VDDIO is at 0 V (back-drive mode), thus charging the node 448 to PC=NG1=VDDIO. The source of transistor 418 and drain of transistor 416 are thus brought to VDDIO during back-drive mode. Transistor 460, in turn, acts as a switch to charge the well of transistor 416 to VDDIO. NMOS transistors 462, 464, 466, 468 provide a current path for the well biasing voltage. Transistor 470, in turn, acts as a switch to charge the gate of transistor 416 to VDDIO. This shuts off transistor 416 and avoids current flow to VDDIO (except for a small leakage current due to the reverse biased parasitic diode of transistor 416 during back-drive mode).

During 5 V tolerant mode, the gate and well of transistor 416, and node 448 are charged to VDDIO by means of the sub-circuit indicated generally by reference numeral 800. Transistor 802 turns on when VDDIO=3.3 V, to cause the gate of transistor 804 to go low and switch on, causing the well potential FW3 to go to VDDIO=3.3 V.

In order to avoid gate oxide breakdown of the transistor 418, the gate of transistor 418 is charged to the same voltage as its drain. This is achieved by connecting the gate to the pad contact 419 via switching transistor 480 and resistor 482 of sub-circuit 484, and connecting the floating well to the pad contact 419 via switching transistor 486 and the resistor 482. With the voltages at the gate and drain of transistor 418 at 5.5 V, the transistor is switched off and no current flows through the transistors 416, 418.

While, in the prior art, the wells of the PMOS transistors are typically both connected to VDDIO, the present invention has to isolate the two wells during stress mode while allowing both wells to still be connected to VDDIO during normal mode. This is necessitated by the fact that the floating wells of the two driver transistors 416, 418 are at different voltage levels during stress mode. This is achieved by means of the switching transistor 488. Transistor 488 is switched off by the high pad voltage through transistor 900 during back-drive and 5 V tolerant mode. Transistors 902, 904, 906 provide a current path via transistor 908, during these modes. (During normal mode, transistor 488 switches on due to the low voltage on its gate. Thus the two wells of transistors 416 and 418 are connected during normal mode.)

It will be appreciated that with the voltages on the drains of the transistors 416, 418 being the same as the voltages on their respective wells, no current flows through the body diodes of the transistors 416,418 to the wells. Also, by having the gate voltage of transistor 418 at 5.5 V and the voltage on the gate of transistor 416 and the node 448 at VDDIO, the gate oxide and junction voltages of transistors 416, 418 are below the allowable limit of 3.8 V.

In order to isolate the pre-driver logic circuitry (indicated generally by reference numeral 500) from the gates of transistors 416, 418, two sets of pass gates are provided. Node 502 is isolated from the gate of transistor 416 by pass gates 504, 506. Since the voltage PG2 on the gate of driver transistor 416 is at about 3 V it does not exceed the breakdown voltage of the two pass gate transistors 504, 506, which thus isolate the node 502 from the PG2 voltage. During back-drive mode, transistor 504 is off since its gate is connected to VDDIO=0 V. The gate of transistor 506, in turn, is connected to Vleak, which is provided by transistor 508 (sub-circuit 510). Thus, when transistor 508 turns on it sets Vleak for the floating well of transistor 416. (Transistors 512, 513,516 provide a current path to ground) Since the gate and source to transistor 506 are thus at substantially the same voltage, transistor 506 switches off. During 5 V tolerant mode transistor 504 is on since its gate is at approximately 3.3 V. Transistor 506 remains off.

Node 520 is, in turn, isolated from the gate of transistor 418 by pass transistors 522, 524. The transistors 522,524 are in series to split the high PG1 voltage. In back-drive mode, the gate of transistor 524 is at NG1 (which is obtained from the sub-circuit 420 that feeds the gate of driver transistor 412). With the drain of transistor 524 at PG1 (the pad voltage), transistor 524 is on. Its source is about one diode drop below the gate, ie., below NG1. Thus, the breakdown voltage of about 3.8 V across the transistor 522 is not exceeded. The drain of transistor 522 is at the source voltage of transistor 524, and its gate is a VDDIO. Thus the voltage across transistor 524 is again below the breakdown voltage. The transistors 524, 522 therefore isolate the node 520 from the pad voltage PG1. Under back-drive mode, the gate of transistor 522 is low and switches the transistor off. During 5 V tolerant mode, with its gate at VDDIO, which is approximately 3.3 V, transistor 522 stays on. In both modes transistor 524 stays on since its gate is at NG1, which is at VDDIO.

Considering the receiver circuitry 600, this is protected by NMOS transistor 602. The gate of transistor 602 is at NG1=3

V. Thus its source is below 3 V (at 3-Vtn) and prevents high voltages from getting to the receiver.

The circuit of FIG. 4 also works in 5 V tolerant mode, as was discussed briefly above, and in normal mode. This is discussed further below.

In 5 V tolerant mode the pad is still at 5.5 V but now the supplies VDD and VDDIO are asserted. Therefore VDDIO is at 3.3 V. The NMOS transistors 412, 414 of the driver circuit 410 again comply with the requirement that the gate to source/drain junction and drain to source voltages do not exceed 3.8 V. This is brought about by the fact that the gate voltage of transistor 412 (NG1) is at 3.3 V and the gate voltage of transistor 414 (NG2) is at ground potential. As was discussed above, when VDDIO is at 3.3 V, transistor 444 turns on causing node 700 to be set at the ground potential. This switches on transistor 442 which thus sets NG1 to the same potential as VDDIO=3.3 V. Transistors 428, 430, and 440, in turn switch off due to their high gate voltage.

With the gate of transistor 414 (NG2) at ground, there is again no current path through the transistors 412, 414.

As regards transistor 418, the gate and well are again charged to the pad voltage of 5.5 V, since transistors 480 and 486 still turn on when VDDIO is at 3.3 V. Since both the gate and drain are at 5.5 V, no current flows through transistor 418, and consequently no current flows through transistor 416.

As regards transistor 416, the sub-circuit 450, is disabled in this mode by the fact that transistor 456 is turned off. Instead, the floating well of transistor 416 is charged to 3.3 V by the sub-circuit 800. Transistor 802 turns on to cause the gate of transistor 804 to go low and switch on, causing the well potential FW3 to go to VDDIO=3.3 V. The transistor 806 shuts off during 5 V tolerant mode to isolate the gate of transistor 804 from FW3. (In backdrive mode transistor 806 switches on and places the gate of transistor 804 at FW3 to switch it off.)

Thus the floating wells of both transistor 416 and 418 are at the same potential as their respective drains, which avoids current flowing through the body diodes to the floating wells.

The gate of transistor 416 (PG2), in turn is charged to 3.3 V since transistor 508 of sub-circuit 510 turns off, causing Vleak to go to ground potential. This, in turn, switches on transistor 506 of the pass gates 504, 506, which causes PG2 to be at the same potential as node 502, which is at VDDIO.

Thus the gates oxide and junction voltages of transistors 416, 418 are below the 3.8 V allowable limit.

It will also be appreciated that transistors 522, 524 (the other set of pass gates) are switched on by the VDDIO and NG1 voltages on their respective gates, but that they serve to isolate the 5.5 V from the node 520 which is at VDDIO=3.3 V.

The receiver input is again protected by transistor 602 since the gate of transistor 602 is at NG1=3 V and the PADIN voltage to the receiver cannot go beyond NG1-Vtn. Thus it isolates the receiver from higher voltages.

The circuitry of the embodiment of FIG. 4 also allows proper functioning during normal mode where the pad is driven by the driver output. As in the case of the 5 V tolerant mode, the floating well of transistor 416 (FW3) and the gate of transistor 412 (NG1) are charged to VDDIO potential. This can be seen from sub-circuits 420 and 800 in which transistors 444 and 802 turn on, causing transistors 442 and 804, respectively, to turn on and charge FW3 and NG1, respectively. Also, transistor 488 will turn on to connect FW3 and FW5, since transistor 900 must turn off, because the pad voltage cannot be greater than NG1. Thus FW5 is brought to the same potential as FW3=VDDIO.

Again Vleak stays at ground since transistor 508 turns off. This causes transistor 506 to turn on and connect node 502 to the gate of transistor 416 (PG2). Also, PG1 goes to ground through transistors 522 and 524, which turn on. The PMOS transistors with their gates connected to VDDIO (transistors 428, 430, 440, of sub-circuit 420, transistor 460 of sub-circuit 450, and transistors 480, 486 of sub-circuit 484) are off.

Although the present invention has been described with reference to a particular embodiment, it will be appreciated that it can be implemented in different ways to avoid gate oxide breakdown and parasitic diode charging of the wells of the driver transistors, without detracting from the scope of the invention.

What is claimed is:

1. A cascoded driver circuit having two PMOS transistors and two NMOS transistors, the transistors each having a drain, a source, a gate, and a well, that includes circuitry for charging the gates and wells of the cascoded PMOS transistors of the driver circuit to the same voltages as the respective drains of the cascaded PMOS transistors.

2. A driver circuit comprising a first PMOS transistor connected to a pad, a second PMOS transistor connected with its drain to the source of the first PMOS transistor, a first NMOS transistor with its drain connected to the pad, and a second NMOS transistor with its drain connected to the source of the first NMOS transistor, wherein means for charging the gate of the first PMOS transistor to substantially the same voltage as the pad, means for charging the well of the first PMOS transistor to substantially the same voltage as the pad, means for charging the drain of the second PMOS transistor is to a voltage that avoids drain-source junction breakdown of the second PMOS transistor, and means for charging the gate and well of the second PMOS transistor to substantially the same voltage as the voltage of the drain of the second PMOS transistor.

3. A driver circuit of claim 2, wherein the gate of the first PMOS transistor is charged to the pad voltage by connecting the gate to the pad through a switch that is switched on when the pad voltage exceeds approximately 3.6 V.

4. A driver circuit of claim 2, wherein the well of the first PMOS transistor is charged to the pad voltage through a switch that is switched on when the pad voltage exceeds approximately 3.3 V.

5. A driver circuit of claim 4, wherein the drain is charged by a clamp circuit that includes a current path defining a plurality of diode voltage drops to VSSIO.

6. A driver circuit of claim 5, wherein the total voltage drop defined by the diode voltage drops is approximately 3.3 V.

7. A driver circuit of claim 5, wherein the wells of the PMOS transistors are isolated by a switch when their voltages are different.

8. A driver circuit of claim 7, wherein a pre-driver circuit is connected to the gates of the PMOS transistors and is isolated from high stress mode voltages from the driver circuit by pass gates.

9. A driver circuit of claim 8, wherein the pass gates between the pre-driver circuit and the gate of the first PMOS transistor comprise two NMOS transistors in series, and the pass gates between the pre-driver circuit and the gate of the second PMOS transistor comprise a PMOS and a NMOS transistor in parallel.

10. A method of enhancing the tolerance of a drive circuit during stress mode, comprising
   providing a cascoded circuit of a first PMOS transistor connected to a pad, a second PMOS transistor, and first and second NMOS transistors,
   charging the gate of the first PMOS transistor to the pad voltage during stress mode, clamping the gate and drain of the second PMOS transistor to the same voltage, and
   switching off both PMOS transistors during stress mode.

11. A method of claim 10, wherein the gate of the first PMOS transistor is charged to the pad voltage by connecting the gate to the pad through a switch that is switched on when the pad voltage exceeds approximately 3.3 V.

12. A method of claim 10, wherein the well of the first PMOS transistor is charged to the pad through a switch that is switched on when the pad voltage exceeds approximately 3.6 V.

13. A method of claim 10, further comprising isolating the wells of the PMOS transistors by a switch when their voltages are different.

14. A method of claim 10, further comprising isolating a pre-driver circuit connected to the gates of the PMOS transistors from high stress mode voltages by providing pass gates between the pre-driver circuit and the gates of the PMOS transistors.

15. A method of claim 14, wherein the pass gates between the pre-driver circuit and the gate of the first PMOS transistor comprise two NMOS transistors in series, and the pass gates between the pre-driver circuit and the gate of the second PMOS transistor comprise a PMOS and a NMOS transistor in parallel.

* * * * *